(12) United States Patent
Laws

(10) Patent No.: US 6,664,824 B2
(45) Date of Patent: Dec. 16, 2003

(54) FREQUENCY DOUBLER CIRCUIT ARRANGEMENT

(75) Inventor: Peter Graham Laws, Swindon (GB)

(73) Assignee: Zarlink Semiconductor Limited, Wiltshire (GB)

(*) Notice: Subject to any disclaimer, the term of this patent is extended or adjusted under 35 U.S.C. 154(b) by 0 days.

(21) Appl. No.: 10/202,477

(22) Filed: Jul. 24, 2002

(65) Prior Publication Data
US 2003/0025537 A1 Feb. 6, 2003

(30) Foreign Application Priority Data
Aug. 3, 2001 (GB) .............................................. 0119014

(51) Int. Cl.[7] .............................................. H03B 19/00
(52) U.S. Cl. ........................ 327/122; 327/116; 327/119
(58) Field of Search ................................ 327/122, 116, 327/119, 120, 254, 255, 356, 359

(56) References Cited

U.S. PATENT DOCUMENTS

| 5,434,522 A | | 7/1995 | Fikart et al. ................. 327/182 |
| 5,815,014 A | * | 9/1998 | Zhang et al. ................ 327/122 |
| 5,995,819 A | * | 11/1999 | Yamaji et al. ............... 455/326 |
| 6,100,731 A | * | 8/2000 | Otaka .......................... 327/119 |
| 6,456,143 B2 | * | 9/2002 | Masumoto et al. ......... 327/356 |
| 6,531,904 B1 | * | 3/2003 | Veit et al. ................... 327/122 |

FOREIGN PATENT DOCUMENTS

GB 0119014.9 9/2001

* cited by examiner

Primary Examiner—Tuan T. Lam
Assistant Examiner—Hiep Nguyen
(74) Attorney, Agent, or Firm—Dority & Manning, P.A.

(57) ABSTRACT

A frequency doubler circuit arrangement comprises a full wave rectifier circuit having an input and a first terminal, the first terminal being connected to a first supply terminal via a first current source, and the input forming an input of the frequency doubler circuit arrangement. A biased transistor circuit is also provided, having a first terminal connected to the first supply terminal via a second current source and being connected to the first terminal of the rectifier circuit. Output terminals of the rectifier circuit and the biased transistor circuit form differential output terminals of the frequency doubler circuit arrangement. The respective outputs of the rectifier circuit and the biased transistor circuit may be connected to a second supply terminal via either an active filter load or a passive filter load, such as an inductance-capacitance-resistance filter. Such a frequency doubler circuit may be employed in a radiotelephone device such that a single voltage controlled oscillator may be utilized to provide signal sources at more than one operating frequency.

20 Claims, 5 Drawing Sheets

FREQUENCY DOUBLER CIRCUIT ARRANGEMENT

CROSS-REFERENCE TO RELATED APPLICATIONS

The present application claims priority to currently pending United Kingdom Patent Application number 0119014.9, filed on Aug. 3, 2001.

STATEMENT REGARDING FEDERALLY SPONSORED RESEARCH OR DEVELOPMENT

N/A

BACKGROUND OF THE INVENTION

The present subject matter generally relates to a frequency doubler circuit arrangement. More particularly, the disclosed technology concerns a frequency doubler circuit arrangement that reduces the number of voltage controlled oscillator modules needed for device operation at multiple frequency bands.

It is common now for cellular telephones to have the capability to operate at multiple frequency bands, typically one band being at around 900 MHz and another at around 1800–1900 MHz. It is common to provide such telephones with a frequency doubler circuit, in order to reduce the number of voltage controlled oscillator (VCO) modules required (a 900 MHz source is doubled up to 1800 MHz).

A known frequency doubler circuit includes a non-linear diode circuit, which generates harmonics of an input signal, one of the harmonics being at twice the frequency of the input signal. However, such circuits are not power efficient, and require significant amounts of filtering to isolate the required harmonic.

Another known circuit is shown schematically in FIG. 1. Referring to FIG. 1, the frequency doubler circuit 10 comprises an input terminal 11, to which is applied an RF signal, a phase shift circuit 12, a mixer 13, a band pass filter 14 and an output terminal 15. The phase shifter circuit 12 produces in-phase and quadrature versions of the input signal, which are supplied to two different signal inputs of the mixer 13. The output of the mixer contains a signal having twice the frequency of the input signal, which is then passed by the filter 14 whereas signals of other frequencies are blocked by it. The need for a phase shift circuit is considered to be disadvantageous, and most implementations also require limiting amplifiers to generate the quadrature drive signals.

A third known frequency doubler circuit is shown schematically in FIG. 2. Referring to FIG. 2, the circuit 20 comprises a pair of bipolar transistors 21, 22, which have their emitter electrodes connected to ground 23 via a resistor 24. The collector electrodes of the transistors 21, 22 are connected together and, via a passive filter load comprising an inductor 25, a capacitor 26 and a resistor 27, to a positive supply terminal 28. A differential input signal is applied to input terminals 29, 30, which are connected to the base electrodes at the transistors 21, 22 respectively, and a single-ended output is provided at an output terminal 31, which is connected to the collectors of the transistors. The transistors 21, 22 effect full-wave rectification of the input signal, with the result being filtered by the filter load 25, 26, 27. As well as not delivering good power conversion efficiency, a single-ended output is provided, whereas differential outputs are usually preferred.

OBJECTS AND SUMMARY OF THE INVENTION

Objects and advantages of the disclosed technology will be set forth in part in the following description, or may be obvious from the description, or may be learned through practice of the technology. The present subject matter recognizes and addresses various drawbacks and other shortcomings related to frequency doubler circuits. Thus, it is a principal object of the presently disclosed technology to provide a frequency doubler circuit, which when utilized in certain electronic devices reduces the number of voltage controlled oscillators (VCOs) that are needed for effective operation of such devices.

It is a further principal object of the present subject matter to provide a frequency doubler circuit arrangement having a differential output and good rejection of the frequency of selected input signals.

Exemplary embodiments of the disclosed technology generally provide for a frequency doubler circuit comprising a full wave rectifier circuit, a biased transistor circuit, and output terminals of the respective full wave rectifier and biased transistor circuits. The full wave rectifier circuit preferably has an input forming an input of the overall frequency doubler circuit and also a first terminal connected to a first supply terminal via a first current source. The biased transistor preferably has a first terminal connected to the first supply terminal via a second current source and also connected to the first terminal of the rectifier circuit. The output terminals of the rectifier circuit and the biased transistor circuit preferably form differential output terminals of the frequency doubler circuit arrangement.

Such exemplary frequency doubler circuits may incorporate other features and elements or combinations of other features and elements to form still further exemplary frequency doubler circuit embodiments. For instance, the first terminal of the biased transistor circuit and the first terminal of the rectifier circuit may be connected via a capacitor. The outputs of the rectifier and biased transistor circuits may be connected to a second supply terminal via a filter load, for example, an inductance-capacitance-resistance filter. The first and second current sources may be substantially constant current sources, such as those formed of transistor-based current mirror circuits.

Alternative embodiments of the disclosed technology provide for radiotelephone devices that comprise at least one voltage controlled oscillator (VCO) and a frequency doubler circuit that enables a single VCO to be employed for providing signal sources at more than one operating frequency. The frequency doubler circuit of such an exemplary such radiotelephone device preferably comprises a full wave rectifier circuit and a biased transistor circuit. Output terminals of the respective full wave rectifier and biased transistor circuits preferably form differential output terminals of the frequency doubler circuit arrangement. The full wave rectifier circuit preferably has an input forming an input of the overall frequency doubler circuit and also a first terminal connected to a first supply terminal via a first current source. The biased transistor may have a first terminal connected to the first supply terminal via a second current source and also connected to the first terminal of the rectifier circuit by a capacitor. The outputs of the rectifier circuit and the biased transistor circuit are preferably connected to a second supply terminal via a filter load.

Additional objects and advantages of the presently disclosed technology will be set forth in part in the description that follows, and in part will be obvious through the description, or may be learned by practice of the technology. The objects and advantages of the present subject matter may be realized and attained by means of the instrumentalities and combinations particularly pointed out in the appended claims.

The accompanying drawings, which are incorporated in and constitute a part of this specification, illustrate at least one presently preferred embodiment of the technology as well as some alternative embodiments. These drawings, together with the description, serve to explain the principles of the present subject matter but by no means are intended to be exhaustive of all of the possible manifestations of the disclosed technology.

BRIEF DESCRIPTION OF THE DRAWINGS

The above and other aspects, features, and advantages of the present subject matter will be more apparent from the following more particular description of exemplary embodiments of the disclosed technology as set forth in the appended figures, in which.

Figure 1:
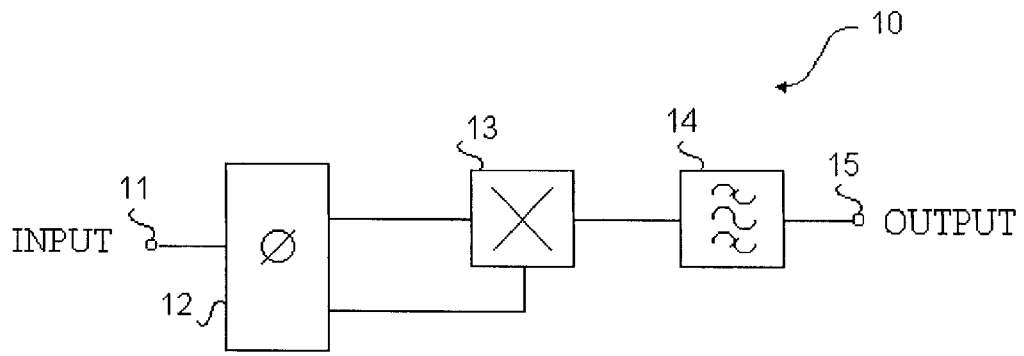
FIG. 1 provides a circuit schematic representation of a known embodiment of an exemplary frequency doubler circuit.
Figure 2:
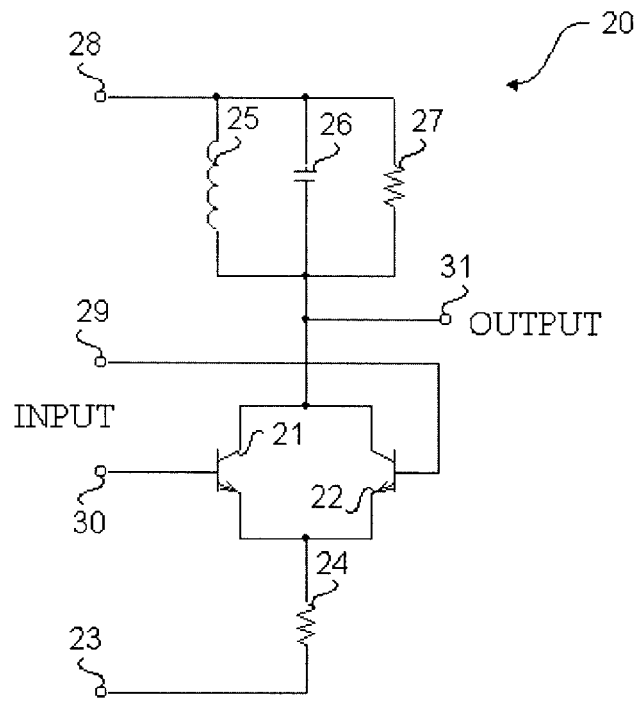
FIG. 2 provides a circuit schematic representation of an additional known embodiment of an exemplary frequency doubler circuit.

Repeat use of reference characters throughout the present specification and appended drawings is intended to represent same or analogous features or elements of the presently disclosed technology.

DETAILED DESCRIPTION OF THE PREFERRED EMBODIMENTS

Reference now will be made in detail to the presently preferred embodiments of the invention, with reference to FIGS. 3 to 6 of the accompanying drawings, which respectively show frequency doubler circuit arrangements in accordance with various exemplary embodiments of the disclosed technology. Each example is provided by way of explanation of the related technology, which is not restricted to the specifics of the examples. In fact, it will be apparent to those skilled in the art that various modifications and variations can be made in the present subject matter without departing from the scope or spirit of the subject matter. For instance, features illustrated or described as part of one embodiment, can be used on another embodiment to yield a still further embodiment. Thus, it is intended that the present subject matter cover such modifications and variations as come within the scope of the appended claims and their equivalents.

Figure 3:
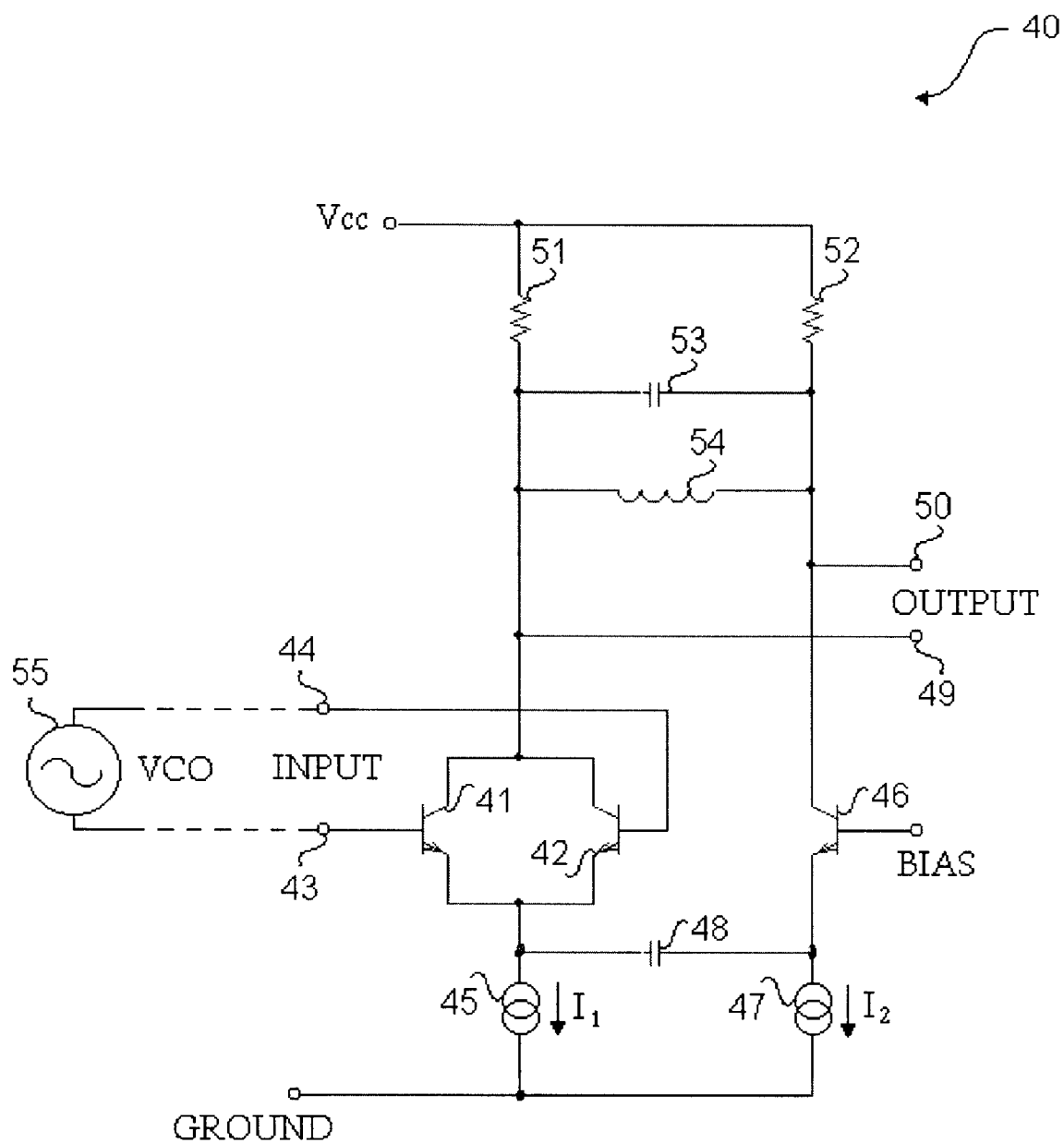
FIG. 3 provides a circuit schematic representation of an exemplary frequency doubler circuit embodiment in accordance with the present subject matter.
Figure 6:
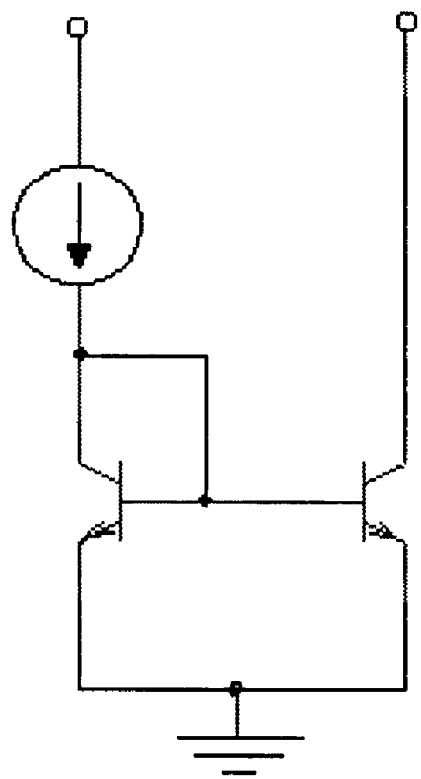
FIG. 6 provides a circuit schematic represenation of a known exemplary transistor-based current mirror circuit in accordance with the present subject matter.

Referring to FIG. 3, a frequency doubler circuit 40 is shown, comprising a full-wave rectifier circuit consisting of first and second npn bipolar transistors 41, 42, which have their collector electrodes connected together and their base electrodes connected to respective terminals 43, 44 of a differential input. The input provided to differential terminals 43, 44 may, for example, come from a voltage controlled oscillator (VCO) 55. By providing a VCO output at a given frequency to frequency doubler circuit 40, a single VCO 55 can be employed for providing signal sources at more than one operating frequency. The emitter electrodes of the transistors 41, 42 are connected together and to ground potential via a first constant current source 45. A biased transistor 46 has its base electrode connected to a source of bias, and its emitter electrode connected to ground potential via a second constant current source 47. The current sources 45, 47 are transistor-based current mirror circuits, an example of which is illustrated in FIG. 6. The emitter electrodes of the rectifier transistors 41, 42, are connected to the emitter electrode of the biased transistor 46 via a first capacitor 48. Differential output terminals, 49, 50 are connected to the collector electrode of the biased transistor 46 and to the commonly connected collector electrodes of the rectifier transistors 41, 42 respectively.

A first resistor 51 connects the commonly connected collector electrodes of the rectifier transistors 41, 42 to a positive supply terminal, Vcc. A second resistor 52 connects the collector electrode of the biased transistor 46 to Vcc. The output terminals 49, 50 are connected together by a second capacitor 53 and an inductor 54, which are connected in parallel. The resistors 51, 52, the capacitor 53 and the inductor 54 together constitute a load, connecting the remainder of the frequency doubler circuit 40 to Vcc, as well as a filter.

Operation of the frequency doubler circuit 40 is as follows. A differential input signal received at the input terminals 43, 42 is full-wave rectified by the rectifying transistors 41, 42. This produces variations in current both at the collectors of the rectifying transistors 41, 42 and at their emitters. The signal provided at the commonly connected emitter electrodes of the rectifying transistors 41, 42 contains a large second order harmonic signal of the input signal, in addition to some higher order even number harmonics. If the input signal is fully symmetrical, i.e., the two halves are equal in amplitude and opposite in phase, minimum levels of the fundamental input frequency and any odd harmonics are generated at the commonly connected emitter electrodes of the rectifying transistors 41, 42.

The biased transistor 46, because its emitter electrode is connected to the emitter electrodes of the rectifying transistors 41, 42, is forced to conduct a current which is in sympathy with, but in anti-phase to, the current signal supplied by the combination of the rectifying transistors. Accordingly, a current signal is provided at the collector electrode of the biased transistor 46, and therefore at the output terminal 50, which has an ac component equal in size but in anti-phase with the current signal provided at the other output terminal 49. The first capacitor 48 provides DC isolation of the biased transistor 46 from the rectifying transistors 41, 42. The connection of the first capacitor 48 also means that the voltage of the source of bias connected to the base electrodes of the biased transistor 46 is not critical, provided that the biased transistor is maintained in a normal operating state. The connection of the first capacitor 48 causes the DC bias state of the output terminals 49, 50 to be determined only by the current sources 45, 47 and by the resistors 51, 52, which allows good balancing of the differential output signal.

Since the differential signal provided by the biased transistor 46 and the rectifier 41, 42 contains a high level of second harmonic signal content, relatively little filtering is required. The load filter is therefore able to take the form of a low Q (quality factor) resonant circuit, which is constituted by the resistors 51, 52, the second capacitor 53 and the inductor 54. Since only a low Q is needed, the load filter is easily fabricated on silicon, allowing the frequency doubler circuit 40 to be implemented easily as a radio-frequency (RF) integrated circuit (IC).

Figure 4:
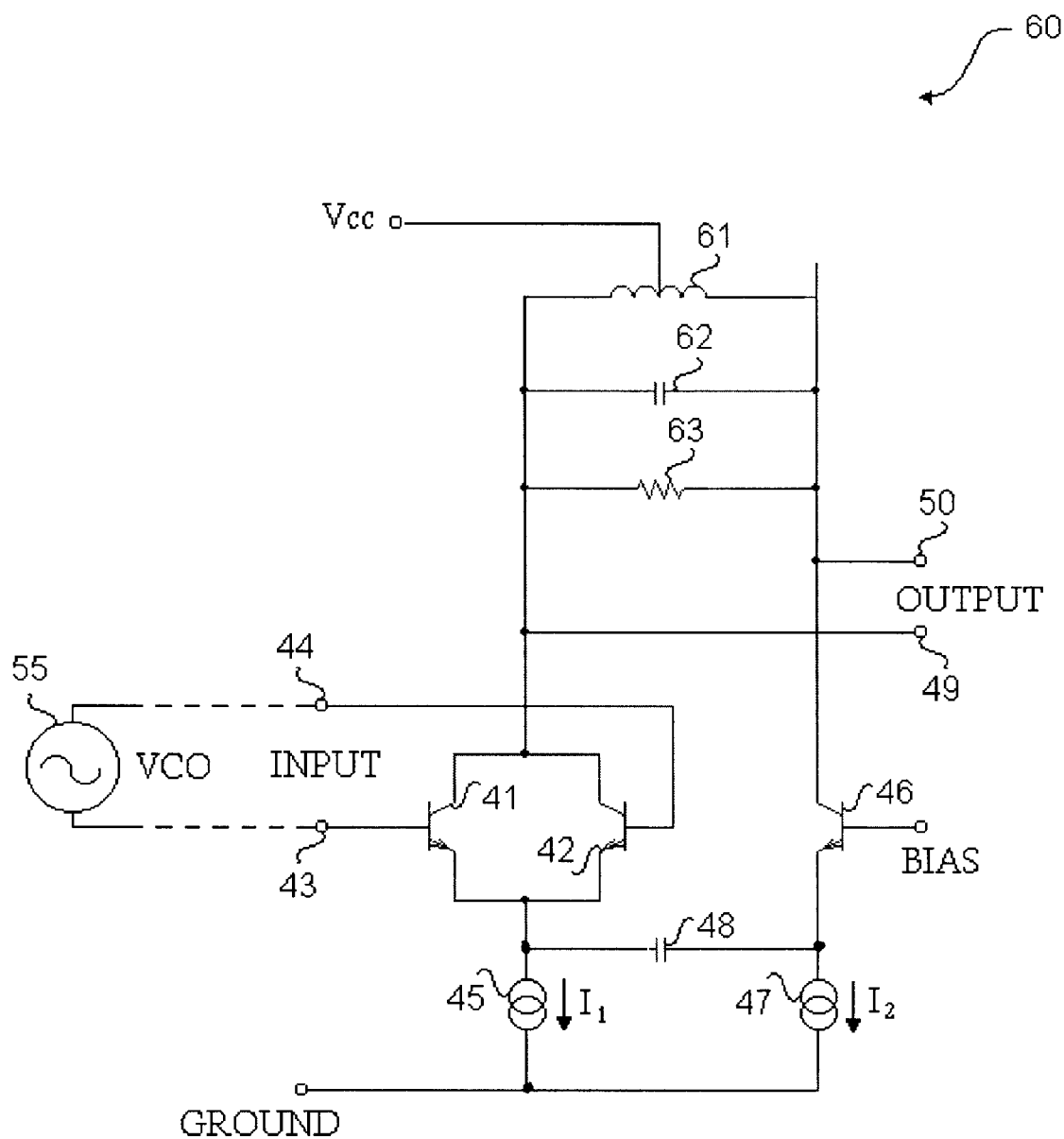
FIG. 4 provides a circuit schematic representation of a further exemplary frequency doubler circuit embodiment in accordance with the present subject matter.

A second embodiment of a frequency doubler circuit arrangement in accordance with the disclosed technology is shown in FIG. 4. Referring to FIG. 4, the frequency doubler circuit 60 is the same as the FIG. 3 circuit, except that a different load filter is present. Reference numerals are retained from FIG. 3 for like elements.

An inductor 61 has a center tap connected to Vcc, and its end terminals connected to respective ones of the output terminals 49, 50. Connected across the inductor 61 in parallel are a capacitor 62 and a resistor 63.

Figure 5:
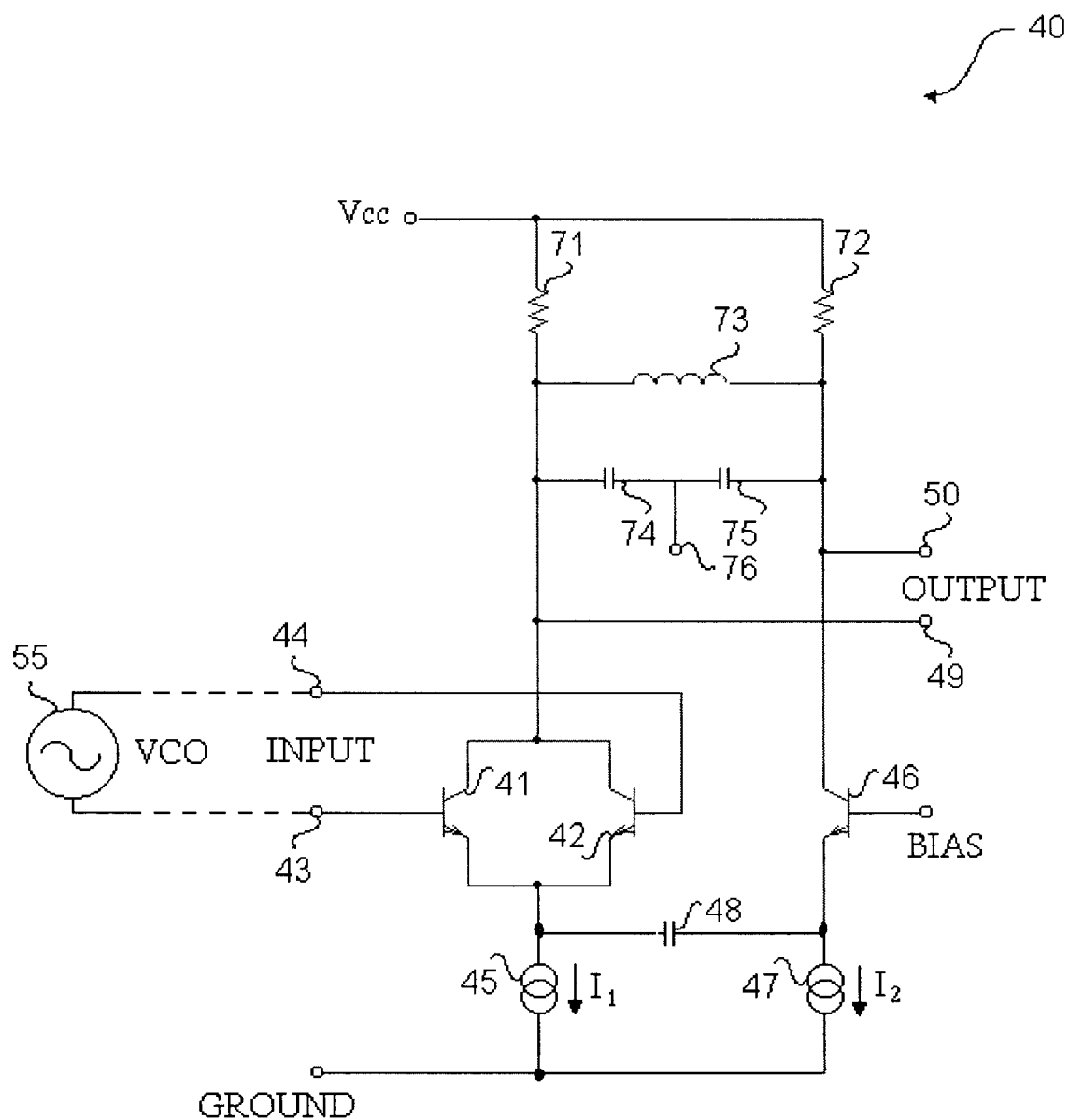
FIG. 5 provides a circuit schematic representation of a still further exemplary frequency doubler circuit embodiment in accordance with the present subject matter.

A further load filter arrangement is shown in the frequency doubler circuit 70 of FIG. 5. Here, first and second resistors 71, 72 connect respectively the commonly connected collector electrodes of the rectifier 41, 42 and the collector electrode of the biased transistor 46 to Vcc. Capacitors 74, 75 may preferably have identical values and are connected in series between the output terminals 49, 50, in parallel to an inductor 73. A terminal 76 is connected to the center point of the capacitors 74, 75. The terminal 76 is a virtual ground terminal, which may be connected to Vcc or to ground.

In an alternative embodiment (not shown), the base electrodes of the rectifying transistors 41, 42 are connected to the input terminals 43, 44 via respective coupling capacitors, and the rectifying transistors are biased by connection to a voltage source via respective high value biasing resistors.

Instead of transistor-based current mirror circuits, the current sources 45, 47 may be resistors, with biasing being effected at the input terminals 43, 44. For low frequency applications, an active filter circuit may be used in place of the passive filters shown in FIGS. 3 to 5. It should be appreciated that such modifications are within the purview of one of ordinary skill in the art and is intended to fall within the spirit and scope of the present subject matter.

It will be appreciated that the described frequency doubler circuits are capable of operating at low supply voltages with good power conversion efficiency and at relatively low cost. It will also be appreciated that the same properties are found when implementing any of the circuits with field effect transistors in place of bipolar transistors.

While at least one presently preferred embodiment of the invention has been described using specific terms, such description is for illustrative purposes only, and it is to be understood that changes and variations may be made without departing from the spirit or scope of the following claims.

What is claimed is:

1. A frequency doubler circuit arrangement comprising:
   a full wave rectifier circuit having first, second, third and fourth terminals, the first terminal being connected to a first supply terminal via a first current source, and the second and third terminals configured as an input of the frequency doubler circuit arrangement; and
   a biased transistor circuit having first and second terminals, the first terminal being connected to the first supply terminal via a second current source and being coupled to the first terminal of the full wave rectifier circuit;
   wherein the fourth terminal of the full wave rectifier circuit and the second terminal of the biased transistor circuit are configured as differential output terminals of the frequency doubler circuit arrangement.

2. A frequency doubler circuit arrangement as claimed in claim 1, in which the first terminal of the biased transistor circuit is connected to the first terminal of the rectifier circuit by a capacitor.

3. A frequency doubler circuit arrangement as in claim 1, in which the outputs of the rectifier circuit and the biased transistor circuit are connected to a second supply terminal via a filter load.

4. A frequency doubler circuit arrangement as claimed in claim 3, in which the filter load is an inductance-capacitance-resistance filter.

5. A frequency doubler circuit arrangement as claimed in claim 4, in which an inductor of the filter has a center-tap connected to the second supply terminal.

6. A frequency doubler circuit arrangement as claimed in claim 3, wherein the filter load is an active filter.

7. A frequency doubler circuit as in claim 1, wherein said full-wave rectifier circuit comprises at least two bipolar transistors.

8. A frequency doubler circuit as in claim 1, in which the current sources are substantially constant current sources.

9. A frequency doubler circuit arrangement as claimed in claim 8, in which the current sources are formed of transistor-based current mirror circuits.

10. A radiotelephone comprising:
    at least one voltage controller oscillator; and
    a frequency doubler circuit configured to receive an output from the at least one voltatge controlled oscillator, wherein the frequency doubler circuit multiplies the frequency of the at least one voltage controlled oscillator for providing one or more operating frequency, said frequency doubler circuit comprising:
      a full wave rectifier circuit having first, second, third and fourth terminals, the first terminal being connected to a first supply terminal via a first current source, and the second and third terminals configured as an input of the frequency doubler circuit arrangement; and
      a biased transistor circuit having first and second terminals, the first terminal being connected to the first supply terminal via a second current source and being coupled to the first terminal of the full wave rectifier circuit;
      wherein the fourth terminal of the full wave rectifier circuit and the second terminal of the biased transistor circuit are configured as differential output terminals of the frequency doubler circuit arrangement; and
      wherein the fourth terminal of the full wave rectifier circuit and the second terminal of the biased transistor circuit are respectively connected to a second supply terminal via a filter load.

11. A radiotelephone as claimed in claim 10, wherein the filter load is an active filter.

12. A radiotelephone as claimed in claim 10, wherein the filter load is an inductance-capacitance-resistance filter.

13. A radiotelephone as claimed in claim 12, in which an inductor of the filter has a center-tap connected to the second supply terminal.

14. A radiotelephone as claimed in claim 10, in which the current sources are substantially constant current sources.

15. A radiotelephone as claimed in claim 14, in which the current sources are formed of transistor-based current mirror circuits.

16. A radiotelephone as claimed in claim 10, wherein said full-wave rectifier circuit comprises at least two bipolar transistors.

17. A frequency doubler circuit arrangement comprising:

a full wave rectifier circuit having first, second, third and fourth terminals, the first terminal being connected to a first supply terminal via a first current source, and the second and third terminals configured as an input of the frequency doubler circuit arrangement; and a biased transistor circuit having first and second terminals, the first terminal being connected to the first supply terminal via a second current source and being coupled to the first terminal of the full wave rectifier circuit;

wherein the fourth terminal of the full wave rectifier circuit and the second terminal of the biased transistor circuit are configured as differential output terminals of the frequency doubler circuit arrangement;

wherein the fourth terminal of the full wave rectifier circuit and the second terminal of the biased transistor circuit are connected to a second supply terminal via an inductance-capacitance-resistance filter load; and wherein the first and second current sources are substantially constant current sources.

18. A frequency doubler circuit arrangement as claimed in claim 17, in which the inductance of the filter has a center-tap connected to the differential output terminals.

19. A frequency doubler circuit arrangement as claimed in claim 17, wherein said full-wave rectifier circuit comprises at least two bipolar transistors.

20. A frequency doubler circuit arrangement as claimed in claim 17, wherein the first and second current sources are formed of transistor-based current mirror circuits.

* * * * *